US008896097B2

(12) United States Patent
Wamura et al.

(10) Patent No.: US 8,896,097 B2
(45) Date of Patent: Nov. 25, 2014

(54) METHOD OF MANUFACTURING CAPACITOR, CAPACITOR AND METHOD OF FORMING DIELECTRIC FILM FOR USE IN CAPACITOR

(71) Applicant: Tokyo Electron Limited, Tokyo (JP)

(72) Inventors: Yu Wamura, Oshu (JP); Koji Akiyama, Nirasaki (JP); Shingo Hishiya, Nirasaki (JP); Katsushige Harada, Nirasaki (JP)

(73) Assignee: Tokyo Electron Limited (JP)

( * ) Notice: Subject to any disclaimer, the term of this patent is extended or adjusted under 35 U.S.C. 154(b) by 29 days.

(21) Appl. No.: 13/760,210

(22) Filed: Feb. 6, 2013

(65) Prior Publication Data

US 2013/0200491 A1    Aug. 8, 2013

(30) Foreign Application Priority Data

Feb. 6, 2012    (JP) ................. 2012-023469

(51) Int. Cl.
| | |
|---|---|
| H01L 21/48 | (2006.01) |
| H01L 49/02 | (2006.01) |
| H01L 21/02 | (2006.01) |
| C23C 16/40 | (2006.01) |
| C23C 16/455 | (2006.01) |
| C23C 16/56 | (2006.01) |

(52) U.S. Cl.
CPC ............... *H01L 28/60* (2013.01); *H01L 28/75* (2013.01); *H01L 28/92* (2013.01); *H01L 21/02186* (2013.01); *H01L 21/02189* (2013.01); *H01L 21/022* (2013.01); *H01L 21/0228* (2013.01); *H01L 21/02356* (2013.01); *C23C 16/405* (2013.01); *C23C 16/45525* (2013.01); *C23C 16/45553* (2013.01); *C23C 16/56* (2013.01)
USPC ............ 257/532; 257/E27.048; 257/E21.008

(58) Field of Classification Search
CPC ................. H01I 21/02197; H01I 21/02266; H01I 21/28211; H01I 21/02186; H01I 21/28194; H01I 21/31604; H01I 21/76849
USPC ....................... 438/381; 257/E27.048, 21.008
See application file for complete search history.

(56) References Cited

U.S. PATENT DOCUMENTS

| | | | | |
|---|---|---|---|---|
| 6,288,420 | B1 * | 9/2001 | Zhang et al. | 257/295 |
| 6,365,123 | B1 * | 4/2002 | Narula et al. | 423/608 |
| 6,445,033 | B1 * | 9/2002 | Hasegawa | 257/324 |
| 6,803,635 | B2 * | 10/2004 | Koyama et al. | 257/411 |

(Continued)

FOREIGN PATENT DOCUMENTS

| | | |
|---|---|---|
| JP | 2001152339 | 6/2001 |
| JP | 2004296814 | 10/2004 |

(Continued)

*Primary Examiner* — Michael Lebentritt
(74) *Attorney, Agent, or Firm* — Cantor Colburn LLP

(57) ABSTRACT

Provided are a method of manufacturing a capacitor capable of achieving a high dielectric constant property and a low leakage current, a capacitor, and a method of forming a dielectric film used in the capacitor. The capacitor is fabricated by forming a lower electrode layer on a substrate; forming a first $TiO_2$ film having an interface control function on the lower electrode layer; forming a $ZrO_2$-based film on the first $TiO_2$ film; performing an annealing process for crystallizing $ZrO_2$ in the $ZrO_2$-based film, after forming the $ZrO_2$-based film; forming a second $TiO_2$ film which serves as a capacity film on the $ZrO_2$-based film; and forming an upper electrode layer on the second $TiO_2$ film.

13 Claims, 9 Drawing Sheets

(56) References Cited

U.S. PATENT DOCUMENTS

| | | | |
|---|---|---|---|
| 7,309,616 B2* | 12/2007 | Nagashima et al. | 438/3 |
| 7,473,565 B2* | 1/2009 | Arisumi et al. | 438/3 |
| 7,476,916 B2* | 1/2009 | Tatsumi et al. | 257/213 |
| 2007/0102742 A1* | 5/2007 | Kil et al. | 257/295 |
| 2011/0018100 A1* | 1/2011 | Nakagawa et al. | 257/532 |

FOREIGN PATENT DOCUMENTS

| | | |
|---|---|---|
| JP | 2008181943 | 8/2008 |
| JP | 2009293302 | 12/2009 |
| WO | 2010082605 | 7/2010 |

\* cited by examiner

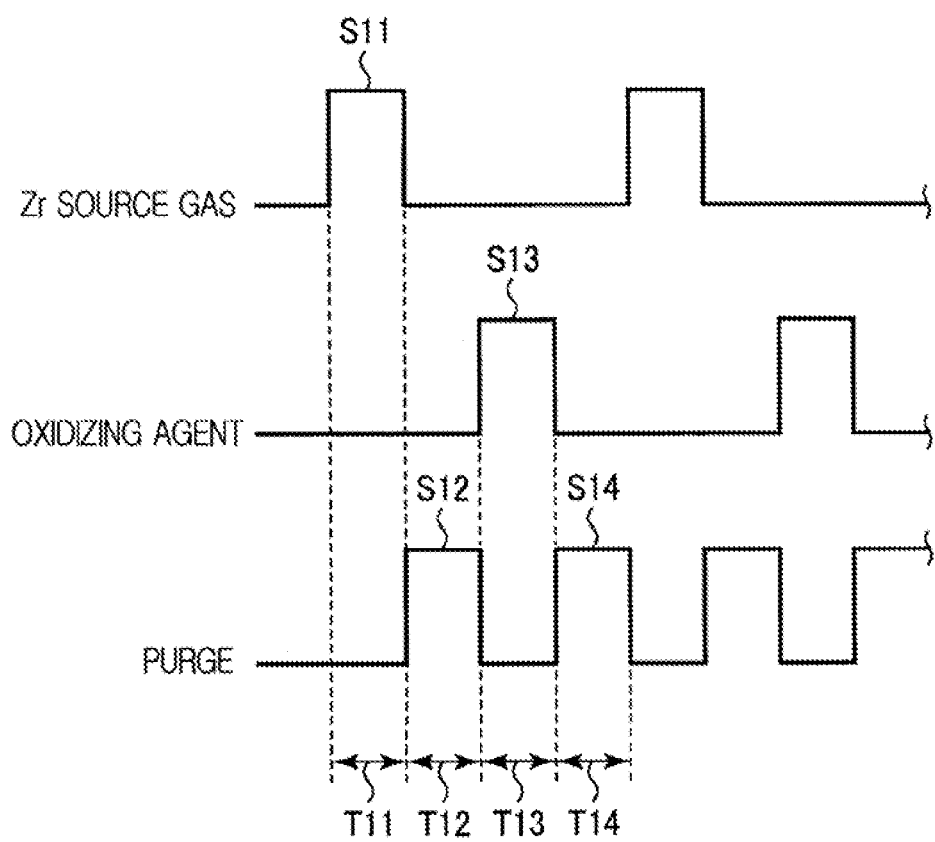

METHOD OF MANUFACTURING CAPACITOR, CAPACITOR AND METHOD OF FORMING DIELECTRIC FILM FOR USE IN CAPACITOR

CROSS-REFERENCE TO RELATED PATENT APPLICATIONS

This application claims the benefit of Japanese Patent Application No. 2012-023469, filed on Feb. 6, 2012, in the Japan Patent Office, the disclosure of which is incorporated herein in its entirety by reference.

BACKGROUND OF THE INVENTION

1. Field of the Invention

The present invention relates to a method of manufacturing a capacitor, a capacitor, and a method of forming a dielectric film used in the capacitor.

2. Description of the Related Art

Recently, from demands for high integration and high speed LSI (large-scale integration), design rules of a semiconductor device configuring the LSI have been miniaturized further. Accompanying with this, increase of a capacity of a capacitor used in a DRAM is requested, and accordingly, increase of dielectric constant of a dielectric film used in the capacitor is also required.

As a dielectric film having high dielectric constant and used in such a capacitor of a DRAM, a zirconium oxide ($ZrO_2$) film is suggested (for example, as in Patent Document 1).

However, in a case where a $ZrO_2$ film alone is applied as a dielectric film of a DRAM capacitor, the $ZrO_2$ film cannot meet the high-K property required as a dielectric film of a next generation DRAM. Thus, a titanium oxide ($TiO_2$) film having higher dielectric constant is highlighted as a next generation dielectric film (for example, as in Patent Document 2).

Also, Patent Document 3 discloses a capacitor using a two-layered metal oxide film that contains Ti such as a $ZrO_2$ film or a $TiO_2$ film as a dielectric film.

As disclosed in the Patent Document 2, when the $TiO_2$ film is used as the dielectric film, there is a problem that the $TiO_2$ basically has a high leakage current and low stability. Thus, to address the above problem, a technology of mixing a dopant such as AlO with $TiO_2$, using a $RuO_2$ film as an electrode material, or forming a Ru film or a Pt film as a base film is being researched; however, the above technology may not provide a sufficient property or have a high technical hurdle. Thus, the DRAM capacitor using the dielectric film that mainly includes the $TiO_2$ film has not been commercialized yet.

Also, since the $ZrO_2$ film is likely to generate oxygen deficit, even if the dielectric film having a two-layered metal oxide film including Ti such as the $ZrO_2$ film and the $TiO_2$ film as disclosed in the Patent Document 3 is used, it is difficult to achieve a desired level of high dielectric constant and low leakage current.

(Patent Document 1) Japanese Laid-open Patent Publication No. 2001-152339
(Patent Document 2) Japanese Laid-open Patent Publication No. 2004-296814
(Patent Document 3) International Application Publication No. 2010/082605 Pamphlet

SUMMARY OF THE INVENTION

The present invention provides a method of manufacturing a capacitor capable of achieving both of high dielectric constant and low leakage current properties, a capacitor, and a method of forming a dielectric film used in the capacitor.

According to an aspect of the present invention, there is provided a method of manufacturing a capacitor, the method including: forming a lower electrode layer on a substrate; forming a first $TiO_2$ film having an interface control function on the lower electrode layer; forming a $ZrO_2$-based film on the first $TiO_2$ film; performing an annealing process for crystallizing $ZrO_2$ in the $ZrO_2$-based film, after forming the $ZrO_2$-based film; forming a second $TiO_2$ film which serves as a capacity film on the $ZrO_2$-based film; and forming an upper electrode layer on the second $TiO_2$ film.

According to another aspect of the present invention, there is provided a capacitor including: a lower electrode layer formed on a substrate; a first $TiO_2$ film which is formed on the lower substrate and has an interface control function; a $ZrO_2$-based film which is formed on the first $TiO_2$ film and is annealed for being crystallized; a second $TiO_2$ film which is formed on the $ZrO_2$-based film and serves as a capacity film; and an upper electrode layer which is formed on the second $TiO_2$ film.

According to another aspect of the present invention, there is provided a method of forming a dielectric film, the method including: forming a first $TiO_2$ film having an interface control function on a lower electrode layer formed on a substrate; forming a $ZrO_2$-based film on the first $TiO_2$ film; performing an annealing process for crystallizing $ZrO_2$ in the $ZrO_2$-based film, after forming the $ZrO_2$-based film; and forming a second $TiO_2$ film which serves as a capacity film on the $ZrO_2$-based film.

According to another aspect of the present invention, there is provided a recording medium storing a program operating in a computer for controlling a film forming apparatus, wherein the program controls the computer to make the film forming apparatus execute the method of forming the dielectric film according to the above aspect of the present invention.

Additional objects and advantages of the invention will be set forth in the description which follows, and in part will be obvious from the description, or may be learned by practice of the invention.

The objects and advantages of the invention may be realized and obtained by means of the instrumentalities and combinations particularly pointed out hereinafter.

BRIEF DESCRIPTION OF THE DRAWINGS

The accompanying drawings, which are incorporated in and constitute a part of the specification, illustrate embodiments of the invention, and together with the general description given above and the detailed description of the embodiments given below, serve to explain the principles of the invention.

FIG. 7 is a timing chart showing gas supply timing when a ZrO$_2$-based film is formed.

DETAILED DESCRIPTION OF THE INVENTION

Figure 1:
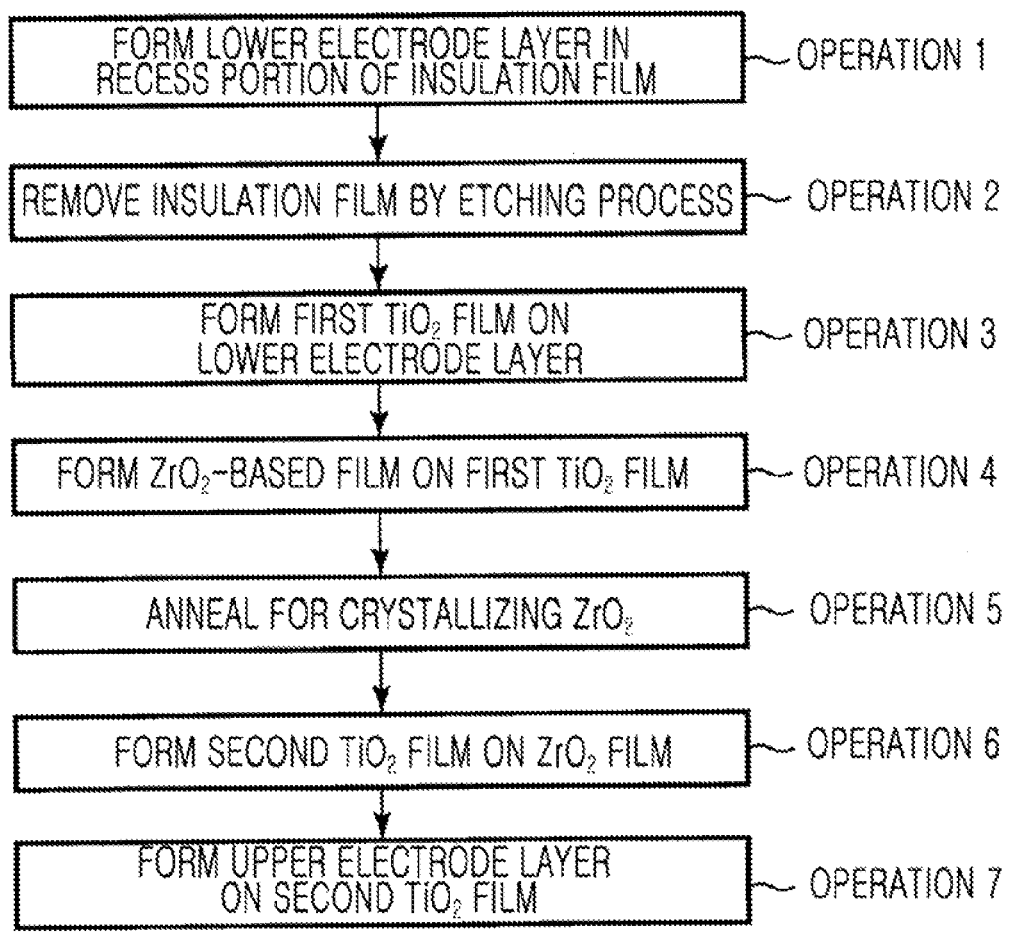
FIG. 1 is a flowchart describing a method of manufacturing a capacitor according to an embodiment of the present invention.

An embodiment of the present invention achieved on the basis of the findings given above will now be described with reference to the accompanying drawing. In the following description, the constituent elements having substantially the same function and arrangement are denoted by the same reference numerals, and a repetitive description will be made only when necessary.

Hereinafter, the present invention will be described in detail by explaining exemplary embodiments of the invention with reference to the attached drawings.

<Embodiments of a Method of Fabricating a Capacitor>

First, a method of manufacturing a capacitor according to an embodiment of the present invention will be described below. Here, a cylinder type capacitor is exemplary shown.

FIG. 1 is a flowchart describing a method of manufacturing a capacitor according to an embodiment of the present invention, and FIGS. 2A through 2G are cross-sectional views showing processes for manufacturing the capacitor.

First, on a semiconductor wafer W in which a plurality of contacts 114 formed of, for example, Ti are formed to correspond to locations where capacitors will be formed, an insulation layer 102 formed of SO$_2$ or the like is formed, and then, portions of the insulation layer 102, which correspond to the contacts 114, are removed by an etching process to form recess portions 116 of high aspect ratio. In addition, a lower electrode layer 104 is formed on a surface of the structure which is formed by the above processes to electrically connect to the contacts 114, and an entire surface is polished by, for example, a chemical mechanical polishing (CMP) method, so that the lower electrode layer 104 only remains on inner walls of the concave portions 116 (operation 1, FIG. 2A).

The lower electrode layer 104 is typically formed as a TiN film, and may be formed by a chemical vapor deposition (CVD) method or an atomic layer deposition (ALD) method by using, for example, a TiCl$_4$ gas as a Ti material gas and using, for example, a NH$_3$ gas as a nitriding gas.

Figure 2A:
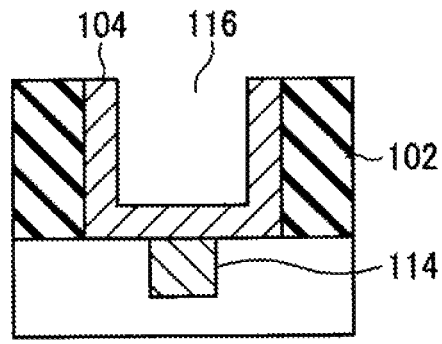
FIGS. 2A through 2G are cross-sectional views illustrating processes in the method of manufacturing the capacitor according to the embodiment of the present invention.
Figure 2B:
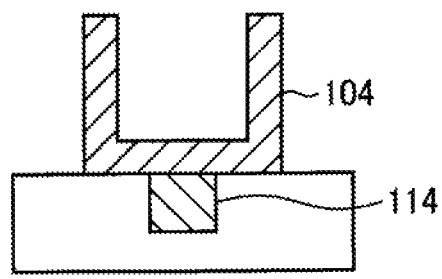

Next, the insulation layer 102 is removed by a wet etching process to remain the lower electrode layer 104 of a cylindrical shape (operation 2, FIG. 2B).

Figure 2C:
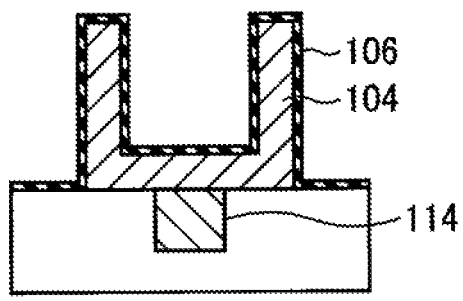

In addition, a first TiO$_2$ film 106 is formed on the lower electrode layer 104 of the cylindrical shape (operation 3, FIG. 2C). The first TiO$_2$ film 106 is formed to provide an interface control in regard to the lower electrode layer 104, and restrains leakage current. In order to obtain the above function, the first TiO$_2$ film 106 may have a thin thickness of about 0.2 to 1.5 nm. If the thickness is less than about 0.2 nm, it is difficult to form the film, and if the thickness is greater than about 1.5 nm, an equivalent oxide thickness (EOT) or a capacitance equivalent thickness (CET) of the dielectric film is increased too much. More preferably, the thickness of the first TiO$_2$ film 106 may be about 0.2 to 1.0 nm. The first TiO$_2$ film 106 may be appropriately formed by the CVD method or the ALD method, as will be described later. The first TiO$_2$ film 106 may be doped with Al, Si, Ta, Nb, or the like.

Figure 2D:
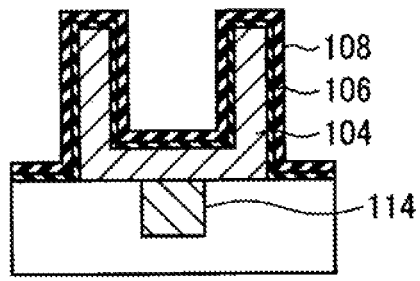

Next, a ZrO$_2$-based film 108 is formed on the first TiO$_2$ film 106 (operation 4, FIG. 2D). The ZrO$_2$-based film 108 is crystallized through a subsequent annealing process and serves to increase a dielectric constant of a second TiO$_2$ film 110 formed thereon. To do this, the ZrO$_2$-based film 108 may have a thickness of about 1 to 10 nm. If the thickness is less than about 1 nm, it is difficult to crystallize the ZrO$_2$ through the annealing, and if the thickness is greater than about 10 nm, the dielectric constant of the dielectric film may be insufficient. More preferably, the thickness of the ZrO$_2$—based film 108 may be about 1 to 5 nm. The ZrO$_2$— based film 108 may be appropriately formed by the CVD method or the ALD method, as will be described later. The ZrO$_2$-based film 108 may include ZrO$_2$ alone. ZrO$_2$ doped with Al, Si, or the like, a ZAZ structure, in which a ZrO$_2$ film and Al$_2$O$_3$ film are stacked, and a LAZO structure, in which a ZrO$_2$ film and an Al$_2$O$_3$ film are alternately formed by an ALD method.

Figure 2E:
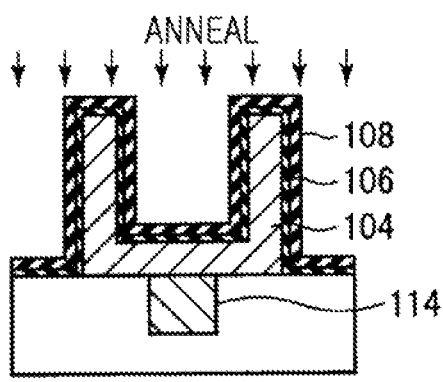

Next, an annealing process for improving crystallization property of the ZrO$_2$ is performed to the structure in which the ZrO$_2$-based film 108 is formed (operation 5, FIG. 2E). The annealing is preferably performed within a temperature range from about 300° C. to 600° C. If the annealing temperature is less than about 300° C., it is difficult to crystallize the ZrO$_2$ in the ZrO$_2$-based film 108, and if the annealing temperature is higher than about 600° C., devices that have been formed before forming the capacitor may be thermally affected. More preferably, the annealing may be performed within a temperature range of about 350° C. to 600° C. The annealing may be performed under an oxygen atmosphere using an O$_2$ gas, an inert gas atmosphere using an N$_2$ gas, or a reduction atmosphere using an H$_2$ gas.

Figure 2F:
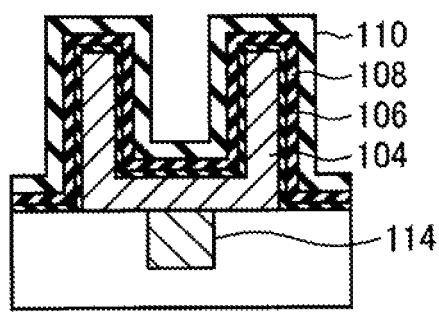

Next, the second TiO$_2$ film 110 is formed on the ZrO$_2$-based film 110 (operation 6, FIG. 2F). The second TiO$_2$ film 110 is formed as a main capacity film. The second TiO$_2$ film 110 may be formed by the CVD or ALD method, as will be described later. The TiO$_2$ may have two kinds of crystal structures, that is, anatase type and rutile type. The anatase is a low temperature phase and has a relative dielectric constant of about 40, whereas the rutile is a high temperature phase and has a relative dielectric constant of 80 or greater. Under a temperature of about 300° or lower where the film is formed by using the CVD method or the ALD method, the anatase of the low temperature phase is grown, and thus. It is difficult to obtain a high dielectric constant. However, when the ZrO$_2$-based film 108 is crystallized by the annealing process, the second TiO$_2$ film 110 formed on the ZrO$_2$-based film 108 has the rutile structure. Therefore, the second TiO$_2$ film 110 has a high dielectric constant, and contributes to a low EOT (low CET). Also, since the second TiO$_2$ film 110 has the rutile type crystal structure, a leakage current to an upper electrode layer 112 formed on the second TiO$_2$ film 110 may be reduced. The second TiO$_2$ film 110 may have a film thickness of about 1 to 20 nm. If the film thickness is less than about 1 nm, the leakage current is increased even though the EOT is good. If the film thickness is greater than about 20 nm, the EOT is increased although the leakage current is reduced. More preferably, the film thickness may be about 1 to 10 nm, and most preferably, about 5 to 10 nm. The second TiO$_2$ film 110 may be doped with Al, Si, Ta, Nb, or the like.

Figure 2G:
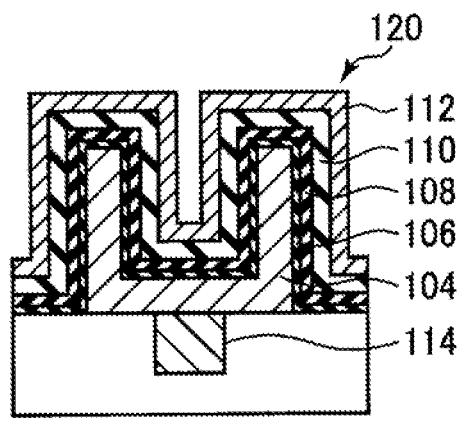

Next, the upper electrode layer 112 is formed on the second TiO$_2$ film 110 to complete the capacitor (operation 7, FIG. 2G). Like the lower electrode layer 104, the upper electrode layer 112 is typically formed as a TiN film via the CVD method or the ALD method by using, for example, a TiCl$_4$ gas as a Ti material gas and using, for example, an NH$_3$ gas as a nitriding gas.

The capacitor 120 includes the lower electrode layer 104, the first TiO$_2$ film 106, the ZrO$_2$-based film 108 that is crystallized by the annealing process, the second TiO$_2$ film 110, and the upper electrode layer 112. Among these, the first TiO$_2$ film 106, the ZrO$_2$-based film 108, and the second TiO$_2$ film 110 constitute a dielectric film. A total thickness of the dielectric film may be about 5 to 25 nm, and more preferably, about 5 to 15 nm.

As described above, since the thin first $TiO_2$ film 106 for interface control is formed on the lower electrode layer 104, the leakage current to the lower electrode layer 104 may be restrained. In addition, after forming the $ZrO_2$-based film 108 on the first $TiO_2$ film 106, the annealing process for crystallizing the $ZrO_2$ is performed, and thus, the $ZrO_2$ of the $ZrO_2$-based film 108 may be crystallized, and the second $TiO_2$ film 110 which is formed on the $ZrO_2$-based film 108 and serves as a capacity film can be grown to have the rutile structure. Accordingly, the dielectric constant of the second $TiO_2$ film 110 can be improved, and the leakage current can be restrained. As such, the high dielectric constant property, that is, the low EOT (low CET), and the low leakage current can be compatibly achieved. Also, a TiN film that is conventionally used can be used as an electrode material, and a special material or a base layer is not necessary. Thus, there is no difficulty in manufacturing the capacitor.

Figure 3:
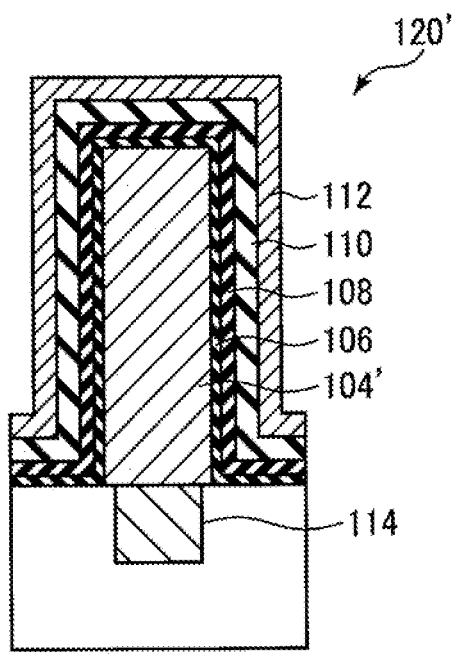
FIG. 3 is a cross-sectional view showing another example of the capacitor.

The structure of the capacitor is not limited to the cylinder type, but may be formed as various types. For example, the capacitor may have a filler type structure that is more advantageous for the fine structure. As shown in FIG. 3, a filler type capacitor 120' is fabricated by forming the first $TiO_2$ film 106 on a filler-shaped lower electrode layer 104', forming the $ZrO_2$-based film 108, crystallizing the $ZrO_2$ of the $ZrO_2$-based film 108 through the annealing process, forming the second $TiO_2$ film 110, and forming the upper electrode layer 112, in the same order as that of manufacturing the above capacitor 120.

<Method of Forming a Dielectric Film>

Next, a method of forming a dielectric film including the first $TiO_2$ film 106, the $ZrO_2$-based film 108, and the second $TiO_2$ film 110 will be described in more detail below.

[Example of a Film Forming Apparatus Used to Form the Dielectric Film]

Figure 4:
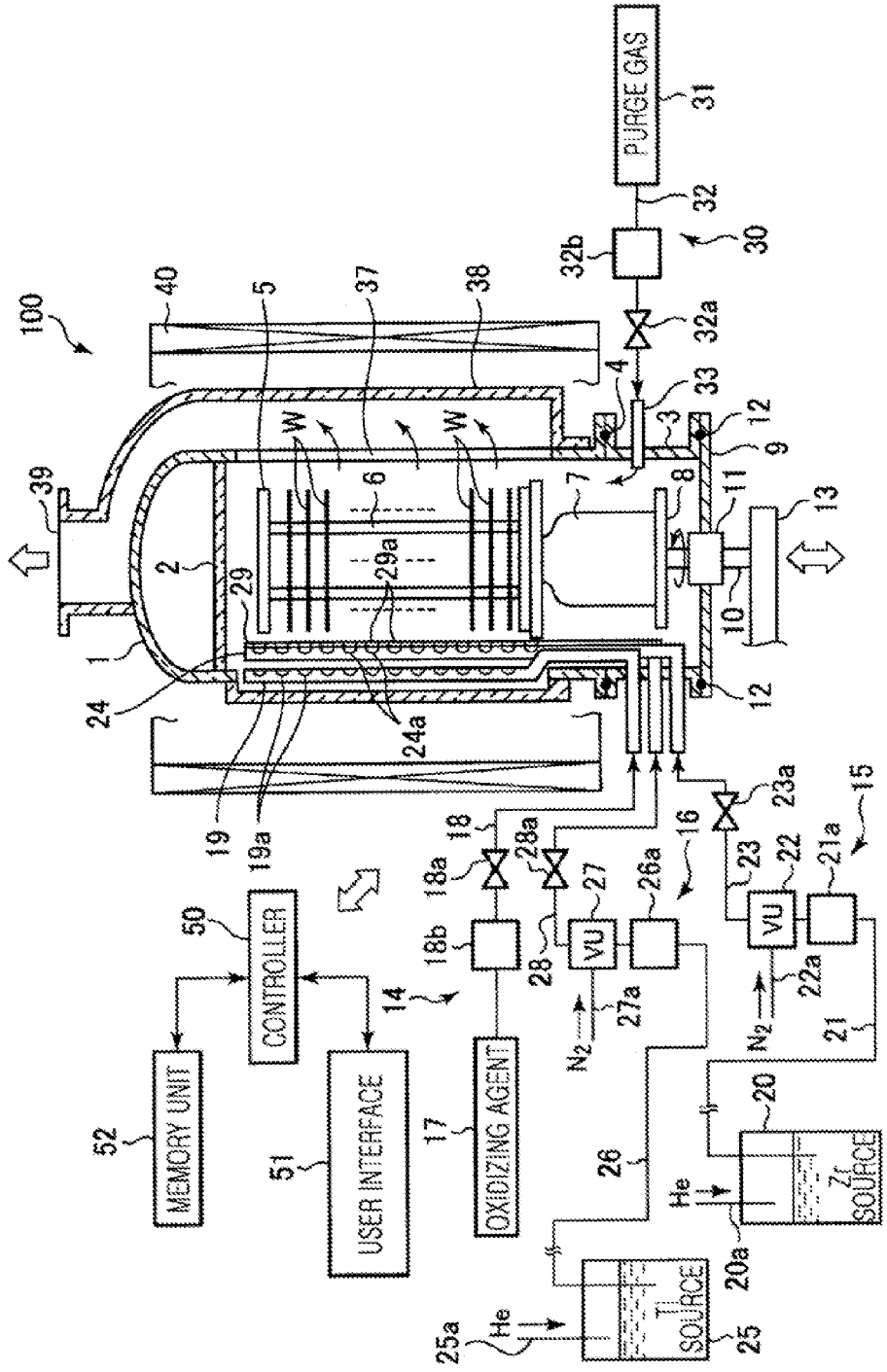
FIG. 4 is a longitudinal sectional view showing an example of a film forming apparatus used to form a dielectric film.
Figure 5:
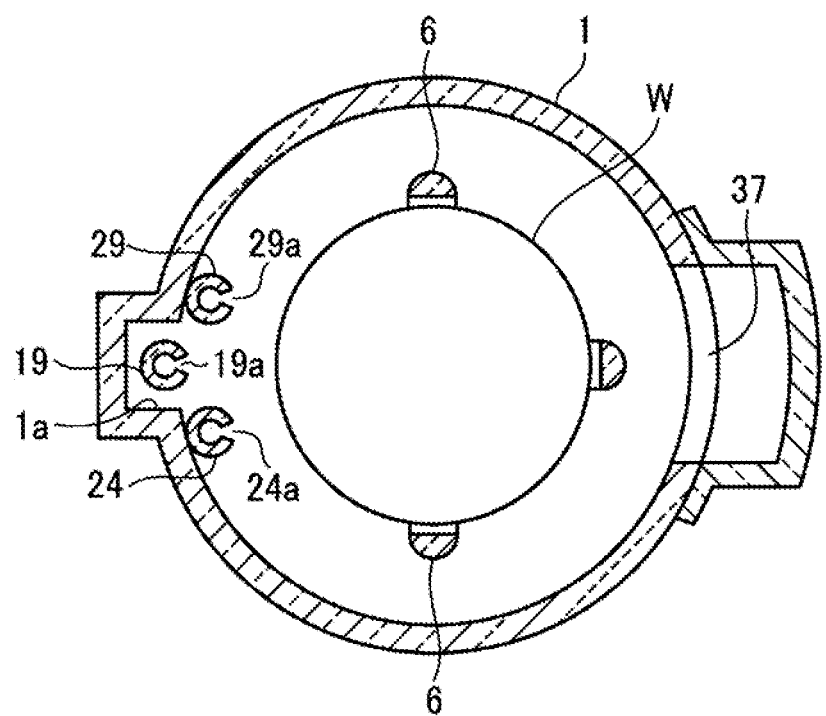
FIG. 5 is a transverse sectional view showing an example of a film forming apparatus used to form a dielectric film.

FIG. 4 is a longitudinal sectional view of an example of a film forming apparatus 100 for forming the dielectric film, and FIG. 5 is a transverse sectional view of the film forming apparatus 100 of FIG. 4. In FIG. 5, a heating apparatus is omitted.

The film forming apparatus 100 includes a processing chamber 1 formed as a cylinder having opened lower end and a ceiling. The processing chamber 1 may be entirely formed of, for example, quartz A ceiling plate 2 formed of quartz is provided and sealed on the ceiling in the processing chamber 1. A manifold 3 formed of, for example, a stainless steel cylinder, is connected to the lower opening of the processing chamber 1 via a sealing member 104 such as an O-ring.

The manifold 3 supports a lower portion of the processing container 1. A wafer boat 5 that is formed of quartz and holds a plurality of semiconductor wafers W (hereinafter, referred to as wafers) as processing targets, for example, about 50 to 100 semiconductor wafers W, in multiple stages is configured to be inserted into the processing container 1 from a lower portion of the manifold 3. The wafer boat 5 includes three pillars 6 (refer to FIG. 5), and the plurality of wafers W are supported by grooves formed in the pillars 6.

The wafer boat 5 is placed on a table 8 via a thermos tube 7 formed of quartz. The table 8 is supported on a rotary shaft 10 that penetrates through a cover unit 9 which opens/closes the lower opening of the manifold 3 and is formed of, for example, stainless steel.

A magnetic fluid seal 11, for example, is provided on a penetration portion of the rotary shaft 10 so as to airtightly seal and rotatably support the rotary shaft 10, A sealing member 12 formed of, for example, an O-ring, is provided between a peripheral portion of the cover unit 9 and the lower end portion of the manifold 3. Accordingly, a sealing property in the processing container 1 may be held.

The rotary shaft 10 is attached to a leading edge of an arm 13 supported by an elevation mechanism (not shown), for example, a boat elevator, so that the wafer boat 5, the cover unit 9, and the like are integrally elevated to be inserted into/withdrawn from the processing chamber 1. Otherwise, the table 8 is fixedly formed at the cover unit 9 so as to perform processes of the wafers W without rotating the wafer boat 5.

The film forming apparatus 100 includes an oxidizing agent supply mechanism 14 for supplying a oxidizing agent gas, for example, an $O_3$ gas, into the processing chamber 1, a Zr source gas supply mechanism 15 for supplying a Zr source gas (Zr material gas) into the processing chamber 1, and a Ti source gas supply mechanism 16 for supplying a Ti source gas (Ti material gas) into the processing chamber 1. Also, the film forming apparatus 100 also includes a purge gas supply mechanism 30 for supplying an inert gas, for example, an $N_2$ gas, as a purge gas into the processing chamber 1.

The oxidizing agent supply mechanism 14 includes an oxidizing agent supply source 17, an oxidizing agent pipe 18 for inducing the oxidizing agent from the oxidizing agent supply source 17, and an oxidizing agent diffusion nozzle 19 which is connected to the oxidizing agent pipe 18, is formed of a quartz pipe, penetrates into the manifold 3 through a side wall of the manifold 3, bends upward and extends perpendicularly. A plurality of gas ejection holes 19a are formed in the oxidizing agent diffusion nozzle 19 at predetermined intervals at the perpendicular portion of the oxidizing agent diffusion nozzle 19, so that the oxidizing agent, for example, the $O_3$ gas, may be evenly discharged from the gas ejection holes 19a toward the processing chamber 1 in a horizontal direction. An $H_2O$ gas, an $O_2$ gas, an $NO_2$ gas, an NO gas, and an $N_2O$ gas may be used as the oxidizing agent, in addition to the above $O_3$ gas. A plasma generation mechanism may be provided to plasmatize the oxidizing agent so as to improve reactivity. Also, an $O_2$ gas and an $H_2$ gas may be used to cause radical oxidation. When using the $O_3$ gas, an ozonizer generating the $O_3$ gas is used as the oxidizing agent supply source 17.

The Zr source gas supply mechanism 15 includes a Zr source storage container 20 in which Zr source formed of a Zr compound is stored, a Zr source pipe 21 for inducing liquid Zr source from the Zr source storage container 20, a vaporizer 22 connected to the Zr source pipe 21 for vaporizing the Zr source, a Zr source gas pipe 23 for inducing a Zr source gas generated by the vaporizer 22, and a Zr source gas diffusion nozzle 24 which is formed of quartz pipe, is connected to the Zr source gas pipe 23, penetrates into the manifold 3 through a side wall of the manifold 3, bends upward and extends perpendicularly. A carrier gas pipe 22a for supplying an $N_2$ gas as a carrier gas is connected to the vaporizer 22. A plurality of gas ejection holes 24a are formed in the Zr source gas diffusion nozzle 24 at predetermined intervals in a length direction of the Zr source gas diffusion nozzle 24, so that the Zr source gas may be evenly discharged from the gas ejection holes 24a in a horizontal direction.

As the Zr compound, for example, a Zr compound including a cyclopentadienyl ring, such as cyclopentadienyl tris(dimethylamino)zirconium ($ZrCp(NMe_2)_3$; CPDTMZ), methycyclopentadienyl tris(dimethylamino)zirconium ($Zr(MeCp)(NMe_2)_3$; MCPDTMZ), and the like may be appropriately used.

The Ti source gas supply mechanism 16 includes a Ti source storage container 25 in which a Ti source formed of a Ti compound is stored, a Ti source pipe 26 for inducing a liquid state Ti source from the Ti source storage container 25, a vaporizer 27 connected to the Ti source pipe 26 to vaporize the Ti source, a Ti source gas pipe 28 for inducing a Ti source gas generated by the vaporizer 27, and a Ti source gas diffusion nozzle 29 which is formed of a quartz pipe, is connected to the Ti source gas pipe 28, penetrates into the manifold 3 through a side wall of the manifold 3, bends upward and extends perpendicularly. A carrier gas pipe 27*a* for supplying an $N_2$ gas as a carrier gas is connected to the vaporizer 27. A plurality of gas ejection holes 29*a* are formed in the Ti source gas diffusion nozzle 29 at predetermined intervals in a length direction of the Ti source gas diffusion nozzle 29, so that the Ti source gas may be evenly discharged from the gas ejection holes 29*a* into the processing chamber 1 in a horizontal direction.

As the Ti compound, for example, a compound including a cyclopentadienyl ring, such as methycyclopentadienyl tris (dimethylamino)titanium (Ti(MeCp)(NMe$_2$)$_3$; MCPDTMT) may be appropriately used.

Additionally, the purge gas supply mechanism 30 includes a purge gas supply source 31, a purge gas pipe 32 for inducing a purge gas from the purge gas supply source 31, and a purge gas nozzle 33 connected to the purge gas pipe 32 and penetrating a side wall of the manifold 3. An inert gas, for example, an $N_2$ gas, may be used as the purge gas.

An opening/closing valve 18*a* and a flow controller 18*b* such as a mass flow controller are provided in the oxidizing agent pipe 18 so that the oxidizing agent gas can be supplied while controlling a flow rate thereof. Also, an opening/closing valve 32*a* and a flow controller 32*b* such as a mass flow controller are provided in the purge gas pipe 32 so that the purge gas can be supplied while controlling a flow rate thereof.

A Zr source pressure feed pipe 20*a* is inserted in the Zr source storage container 20, and the liquid type Zr source is fed into the Zr source pipe 21 by supplying a pressure feed gas such as a He gas from the Zr source pressure feed pipe 20*a*. A flow controller 21*a* such as a liquid mass flow controller is provided in the Zr source pipe 21, and a valve 23*a* is provided in the Zr source gas pipe 23.

A Ti source pressure feed pipe 25*a* is inserted in the Ti source storage container 25, and the Ti source liquid is fed into the Ti source pipe 26 by supplying a pressure feed gas such as a He gas from the Ti source pressure feed pipe 25*a*. A flow controller 26*a* such as a liquid mass flow controller is provided in the Ti source pipe 26, and a valve 28*a* is provided in the Ti source gas pipe 28.

The oxidizing agent diffusion nozzle 19 for discharging the oxidizing agent is provided in a recess portion 1*a* of the processing chamber 1, and the Zr source gas diffusion nozzle 24 and the Ti source gas diffusion nozzle 29 are provided so that the oxidizing agent diffusion nozzle 19 can be interposed therebetween.

An exhaust hole 37 for vacuum exhausting the processing chamber 1 is formed at a side opposite to the oxidizing agent diffusion nozzle 19, the Zr source gas diffusion nozzle 24, and the Ti source gas diffusion nozzle 29 in the processing chamber 1. The exhaust hole 37 is formed thin and long by shaving off the side wall of the processing chamber 1 in an up-and-down direction. An exhaust hole cover member 38 having a U-shaped cross-section to cover the exhaust hole 37 is welded and attached to a portion which corresponds to the exhaust hole 37 in the processing chamber 1. The exhaust hole cover member 38 extends upward along the side wall of the processing chamber 1, and defines a gas outlet 39 at an upper portion of the processing chamber 1. A vacuum exhaustion mechanism (not shown) which includes a vacuum pump and the like and performs vacuum suction is provided to the gas outlet 39. A heating unit 40 formed as a cylinder for heating the processing chamber 1 and the wafers W in the processing chamber 1 is provided to surround an outer circumference of the processing chamber 1.

Also, as described above, the $ZrO_2$-based film may be doped with Al, Si, or the like, and may have the ZAZ structure or the LAZO structure, and the first and second $TiO_2$ films may be doped with Al, Si, Ta, Nb, and the like. In this case, a supply mechanism for supplying a material of doped element or a material of Al when forming the ZAZ structure or the LAZO structure may be additionally provided.

Control of each of the components of the film forming apparatus 100, for example, supplying and stopping of each gas by opening/closing the opening/closing valves 18*a*, 23*a*, 28*a*, and 32*a*, controlling of the flow rate of the gas or the liquid source by using the flow controller 18*b*, 21*a*, 26*a*, and 32*b*, switching of the gas introduced in the processing chamber 1, controlling of the heating unit 40, and the like are performed by a controller 50 formed of, for example, a micro processor (computer). A user interface 51 including a keyboard that receives an input operation of a command or the like for an operator to control the film forming apparatus 100 or a display that visibly displays an operating state of the film forming apparatus 100 is connected to the controller 50.

In addition, a memory unit 52 for storing a controlling program for performing the various processes performed in the film forming apparatus 100 under a control of the controller 50 or storing a program for performing a process in each of components of the film forming apparatus 100 according to processing condition, that is, a recipe, is connected to the controller 50. The recipe is recorded in a recording medium of the memory unit 52. The recording medium may be a fixed unit such as a hard disk, or a portable unit such as a CD-ROM, a DVD, a flash memory, or the like. Also, the recipe may be appropriately transferred from another device via, for example, an exclusive line.

In addition, if necessary, a certain recipe is called out of the memory unit 52 by a command or the like from the user interface 51, and executed in the controller 50, and thus a predetermined process in the film forming apparatus 100 is performed under the control of the controller 50. That is, the recording medium of the memory unit 52 stores a program (that is, a processing recipe) for executing a film forming method that will be described below, and the program controls the film forming apparatus 100 to make the controller 50 execute the film forming method of the dielectric film that will be described below.

[Forming of a Dielectric Film by the Film Forming Apparatus]

Next, a method of forming the dielectric film by the film forming apparatus 100 configured as above will be described below.

First, the wafer boat 5 on which a plurality of, for example, about 50 to 100, wafers W are placed under room temperature is elevated to be loaded in the processing chamber 1 at a predetermined temperature from a lower portion of the processing chamber 1, and the cover unit 9 closes the lower opening of the manifold 3 to seal the processing chamber 1. In addition, the inside of the processing chamber 1 is maintained at predetermined processing pressure by performing a vacuum suction of the inside of the processing chamber 1, and at the same time, a power supply to the heating unit 40 is controlled to increase the temperature of the wafers W to maintain the processing temperature. Then, a film forming process begins in a state where the wafer boat 5 is rotated.

When forming the dielectric film, as described above, processes of forming the first $TiO_2$ film, forming the $ZrO_2$-based film, annealing, and forming the second $TiO_2$ film are performed, and the above processes are performed as below.

1. Process of Forming the First $TiO_2$ Film

The first $TiO_2$ film is formed by using the above described Ti source gas formed of the Ti compound and the oxidizing agent, while the heating unit 40 heats the so processing chamber 1 to a temperature of about 200 to 300° C. In particular, as shown in a timing chart of FIG. 6, a $TiO_2$ film having a predetermined film thickness is formed by performing, repeatedly and a plurality of times, a cycle of $TiO_2$ film forming operation via the ALD method, herein a cycle of $TiO_2$ film forming operation includes a step S1 for supplying the Ti source gas to the processing chamber 1 to be adsorbed on a $ZrO_2$ film, a step S2 for purging the inside of the processing chamber 1 by using a purge gas, a step S3 for supplying a oxidizing agent gas, for example, an $O_3$ gas, to the processing chamber 1 to oxidize the Ti source gas, and a step S4 for purging the inside of the processing chamber 1 with the purge gas. Also, as described above, the first $TiO_2$ film can be doped with the Al, Si, Ta, Nb, and the like, and in this case, a step of supplying a material of the element by the number of times according to a doped amount may be inserted in the repeated cycle.

In the step S1, the Ti source storage container 25 of the Ti source gas supply mechanism 16 supplies the Ti compound that is the Ti source, the vaporizer 27 vaporizes the Ti compound to generate the Ti source gas, and the Ti source gas is supplied to the processing chamber 1 for a time period of T1 from the gas ejection holes 29a via the Ti source gas pipe 28 and the Ti source gas diffusion nozzle 29. Accordingly, the Ti source gas is adsorbed on the lower electrode.

The time period T1 of the step S1 may be, for example, about 0.1 to 1800 sec. In addition, a flow rate of the Ti source may be, for example, about 0.01 to 10 ml/min (ccm). Also, at that time, a pressure in the processing chamber 1 may be, for example, about 0.3 to 66650 Pa.

In the step S3 for supplying the oxidizing agent, the oxidizing agent, for example, the $O_3$ gas, is ejected from the oxidizing agent supply source 17 of the oxidizing agent supply mechanism 14 via the oxidizing agent pipe 18 and the oxidizing agent diffusion nozzle 19. Accordingly, the Ti source adsorbed on the lower electrode is oxidized to form the $TiO_2$ film.

A time period T3 of the step S3 may be within a range of about 0.1 to 1800 sec. A flow rate of the oxidizing agent may vary depending on the number of loaded wafers W or a kind of the oxidizing agent; however, when the $O_3$ gas is used as the oxidizing agent gas and the number of loaded wafers W is about 50 to 100, the flow rate of the oxidizing agent may be, for example, about 1 to 500 g/Nm$^3$. Also, the pressure in the processing chamber 1 may be, for example, about 0.3 to 66650 Pa.

The steps S2 and S4 are performed to remove remaining gas in the processing chamber 1 after the step S1 and step S3, so as to generate a desired reaction in a next step. The purge gas, for example, an $N_2$ gas, is supplied to the processing chamber 1 from the purge gas supply source 31 of the purge gas supply mechanism 30 via the purge gas pipe 32 and the purge gas nozzle 33, so as to purge the inside of the processing chamber 1. In this case, the vacuum suction and the supply of the purge gas are performed repeatedly to improve an efficiency of removing the remaining gas. Time periods T2 and T4 for performing the step S2 and S4 may be, for example, about 0.1 to 1800 sec. In addition, the pressure in the processing chamber 1 may be, for example, about 0.3 to 66650 Pa.

Here, in the step S2 after the step S1 for supplying the Ti source gas and in the step S4 after the step S3 for supplying the oxidizing agent, a time for vacuum suction and a time for supplying the purge gas may be switched due to a difference of properties of the gas discharge. In particular, it takes longer to discharge the gas after performing the step S1 than after the step S3 and accordingly the time for performing the step S2 after the step S1 may be increased.

2. Process of Forming the $ZrO_2$-Based Film

The $ZrO_2$-based film is formed by using the above described Zr source gas formed of the Zr compound and the oxidizing agent, while heating the inside the processing chamber 1 to a temperature of about 200 to 300° C. by using the heating unit 40. In more detail, as shown in a timing chart of FIG. 7, a $ZrO_2$-based film having a predetermined film thickness is formed by performing, repeatedly and a plurality of times, a cycle of $ZrO_2$ film forming operation via the ALD method, herein the cycle of $ZrO_2$ film forming operation includes a step S11 for supplying the Zr source gas to the processing chamber 1 to be adsorbed on the first $TiO_2$ film, a step S12 for purging the inside of the processing chamber 1 by using a purge gas, a step S13 for supplying a oxidizing agent gas, for example, an $O_3$ gas, to the processing chamber 1 to oxidize the Zr source gas, and a step S14 for purging the inside of the processing chamber 1 with the purge gas. Also, as described above, the $ZrO_2$-based film may be doped with the Al, Si, or the like, or may have the ZAZ structure and the LAZO structure, and in this case, following operation may be performed. First, when the $ZrO_2$-based film is doped with the Al, Si, or the like, a step of supplying a material of the element may be inserted in the cycle of the steps S11 through S14, by the number of times according to the doped amount. In a case where the ZAZ structure is used, an Al compound supply mechanism is additionally provided, and then, a $ZrO_2$ film of a predetermined film thickness is formed by using the ALD operation for a predetermined times, an $Al_2O_5$ film is formed by the same ALD operation, and additionally, a $ZrO_2$ film is formed by the ALD method. Also, in a case where the LAZO structure is used, the Al compound supply mechanism is additionally provided as described above, and then, a Zr source gas supplying step, an oxidizing step, an Ar source gas supplying step, and an oxidizing step are alternately and repeatedly performed.

In the step S11, the Zr source storage container 20 of the Zr source gas supply mechanism 15 supplies the Zr compound that is the Zr source, the vaporizer 22 vaporizes the Zr compound to generate the Zr source gas, and the Zr source gas is supplied to the processing chamber 1 for a time period of T1 from the gas ejection holes 24a via the Zr source gas pipe 23 and the Zr source gas diffusion nozzle 24. Accordingly, the Zr source gas is adsorbed on the wafer W.

The time period T1 of the step S11 may be, for example, about 0.1 to 1800 sec. In addition, a flow rate of the Zr source may be, for example, about 0.01 to 10 ml/min (ccm). Also, a pressure in the processing chamber 1 may be, for example, about 0.3 to 66650 Pa.

The step S13 for supplying the oxidizing agent, and the steps S12 and S14 for purging are performed in the same manner as the step S3 for supplying the oxidizing agent and the purging steps S2 and S4 when forming the first $TiO_2$ film. Time periods T13, T12, and T14 are the same as T3, T2, and T4.

3. Annealing Process

The annealing process is performed for a predetermined time after finishing the forming of the $ZrO_2$-based film, in a state where the pressure in the processing chamber 1 becomes a decompression state of a predetermined pressure while introducing a predetermined atmospheric gas to the processing chamber 1 and the heating unit 40 heats the processing chamber 1 to a temperature of about 300 to 600° C., as described above. If the annealing process is performed under an inert environment, the $N_2$ gas, i.e., may be introduced to the processing chamber 1 from the purge gas supply source 31. If the annealing process is performed under an oxidizing environment, the oxidizing agent may be introduced to the processing chamber 1 from the oxidizing agent supply source 17 or an $O_2$ gas may be introduced from $O_2$ gas introduction mechanism which is additionally provided. Also, if the annealing process is performed under a reduction environment, a mechanism for introducing a reducing gas such as an $H_2$ gas may be additionally provided.

4. Process of Forming the Second $TiO_2$ Film

Figure 6:
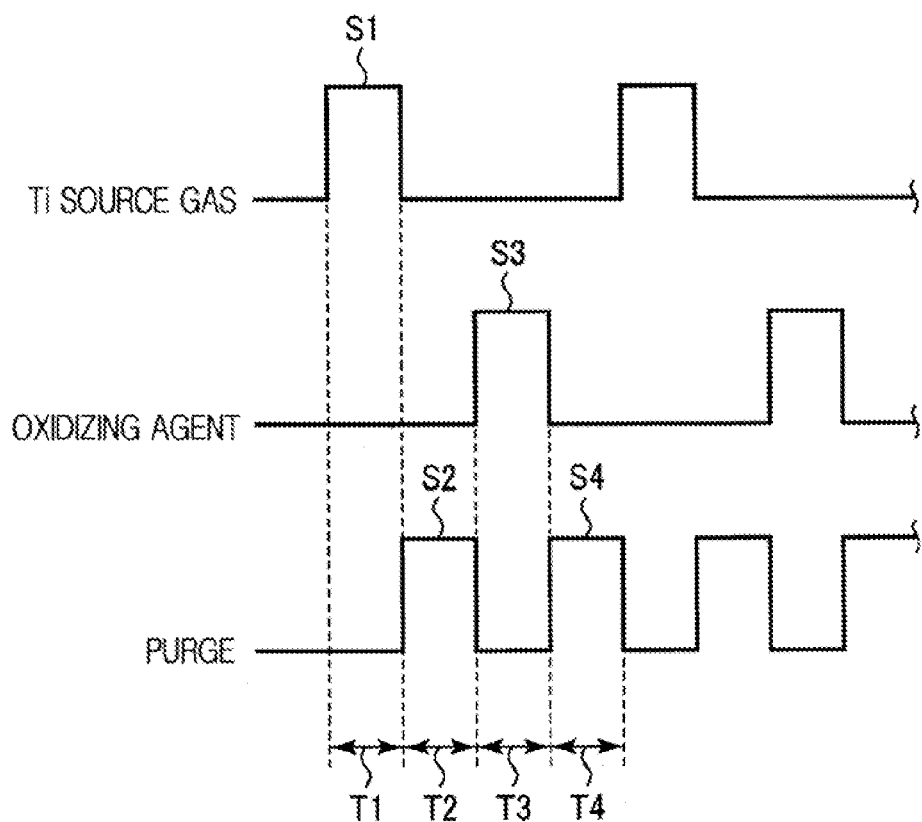
FIG. 6 is a timing chart showing timings of supplying gases when a first TiO$_2$ film to and a second TiO$_2$ film are formed.

Like the first $TiO_2$ film, the second $TiO_2$ film can be formed by using the Ti source gas formed of the Ti compound and the oxidizing agent, according to the ALD method shown in the timing chart of FIG. 6. Also, as described above, the second $TiO_2$ film can be doped with the Al, Si, Ta, Nb, and the like, and in this case, a step of supplying a material of the element by a number of times according to a doped amount may be inserted in the repeated cycle.

As described above, the first and second $TiO_2$ films are formed by using the Ti source gas and the oxidizing agent via the ALD method, and the $ZrO_2$-based film is formed by using the Zr source gas and the oxidizing gas via the ALD method, and thus, a film having less impurities and defects may be obtained under a relatively low temperature. In particular, in a case where a compound containing the cyclopentadienyl ring is used as the Ti source gas and the Zr source gas, an side opposite to the cyclopentadienyl ring becomes an adsorption site, and thereby performing the adsorbing and arranging regularly and obtaining a dense film having less impurities and defects.

<Experimental Result for Identifying Effects of the Present Invention>

Next, experimental results for identifying the effects of the present invention will be described below.

Here, on a TiN film as a lower electrode, a first $TiO_2$ film was formed to a thickness of about 1 nm, a $ZrO_2$ film was formed on the first $TiO_2$ film to a thickness of about 5 nm, and then, an annealing was performed at a temperature of about 500° C. for about 10 minutes under an $N_2$ gas environment, and a second $TiO_2$ film was formed on the $ZrO_2$ film to a thickness of about 5 nm, thereby forming a dielectric film having a total thickness of about 11 nm. Then, a TiN film as an upper electrode was formed on the second $TiO_2$ film to manufacture a flat capacitor sample.

The first and second $TiO_2$ films were formed by using an MCPDTMT as the Ti source and the $O_3$ gas as the oxidizing agent in the ALD method having the sequences shown in the timing chart of FIG. 6 by the film forming apparatus 100 shown in FIG. 4. Also, the $ZrO_2$ film was formed by using a CPDTMZ as the Zr source and the $O_3$ gas as the oxidizing agent in the ALD method having the sequences shown in the timing chart of FIG. 7 by the film forming apparatus shown in FIG. 4.

With respect to the sample obtained through the above processes, a CET and a leakage current (J+1V) when Vg is 1V were measured, and the CET was about 0.437 nm and J+1V was about $1.6 \times 10^{-6}$ $A/cm^2$ that result in good values.

<Other Application>

The present invention may be variously modified without limiting to the above embodiments. For example, in the above embodiment, the first and second $TiO_2$ films and the $ZrO_2$-based film are formed by using the ALD method; however, the present invention is not limited thereto, and the above films may be formed by using the CVD method. Also, the forming of the first and second $TiO_2$ films and the $ZrO_2$-based film are formed by a batch-type film forming apparatus, in which the film forming operations are performed in a lump with respect to a plurality of wafers W loaded therein; however, the present invention is not limited thereto, and may be applied to a single-wafer type film forming apparatus which performs the film forming operation on one wafer at a time.

According to the present invention, the first $TiO_2$ film is formed on the lower electrode for interface control, and thus, the leakage current to the lower electrode may be restrained. Also, after forming the $ZrO_2$-based film on the first $TiO_2$ film, the annealing process for crystallizing the $ZrO_2$ is performed, and thus, the $ZrO_2$ in the $ZrO_2$-based film can be crystallized. Thus, the second $TiO_2$ film formed on the $ZrO_2$-based film and serving as a capacity film can be grown to have the rutile structure. Accordingly, the dielectric constant of the second $TiO_2$ film is increased, and the leakage current to the upper electrode can be also restrained. As such, the high dielectric constant property and the low leakage current can be achieved compatibly. Also, the TiN film that is conventionally used can be used as the electrode material, and thus, a unique electrode material or a base is not necessary, and there is no difficulty in fabricating the capacitor.

What is claimed is:

1. A method of manufacturing a capacitor, the method comprising:
   forming a lower electrode layer on a substrate;
   forming a first $TiO_2$ film having an interface control function on the lower electrode layer;
   forming a $ZrO_2$-based film on the first $TiO_2$ film;
   performing an annealing process for crystallizing $ZrO_2$ in the $ZrO_2$-based film, after forming the $ZrO_2$-based film;
   forming a second $TiO_2$ film which serves as a capacity film, on the $ZrO_2$-based film; and
   forming an upper electrode layer on the second $TiO_2$ film.

2. The method of claim 1, wherein the first $TiO_2$ film has a film thickness of about 0.2 to 1.5 nm, the $ZrO_2$-based film has a film thickness of about 1 to 10 nm, and the second $TiO_2$ film has a film thickness of about 1 to 20 nm.

3. The method of claim 1, wherein the annealing process is performed under a temperature of about 300° C. to 600° C.

4. The method of claim 1, wherein the first and second $TiO_2$ films and the $ZrO_2$-based film are formed by supplying a Ti source gas formed of a Ti compound or a Zr source gas formed of a Zr compound, and an oxidizing agent.

5. The method of claim 4, wherein the first and second $TiO_2$ films are formed by supplying the Ti source gas formed of the Ti compound and the oxidizing agent alternately for a plurality of times, and the $ZrO_2$-base film is formed by supplying the Zr source gas formed of the Zr compound and the oxidizing agent alternately for a plurality of times.

6. The method of claim 1, wherein a TiN film is used as the upper electrode layer and the lower electrode layer.

7. A method of forming a dielectric film, the method comprising:
   forming a first $TiO_2$ film having an interface control function on a lower electrode layer formed on a substrate;
   forming a $ZrO_2$-based film on the first $TiO_2$ film;
   performing an annealing process for crystallizing $ZrO_2$ in the $ZrO_2$-based film, after forming the $ZrO_2$-based film; and
   forming a second $TiO_2$ film which serves as a capacity film, on the $ZrO_2$-based film.

8. The method of claim 7, wherein the first $TiO_2$ film has a film thickness of about 0.2 to 1.5 nm, the $ZrO_2$-based film has a film thickness of about 1 to 10 nm, and the second $TiO_2$ film has a film thickness of about 1 to 20 nm.

9. The method of claim 7, wherein the annealing process is performed under a temperature of 300° C. to 600° C.

10. The method of claim 7, wherein the first and second $TiO_2$ films and the $ZrO_2$-based film are formed by supplying a Ti source gas formed of a Ti compound or a Zr source gas formed of a Zr compound, and an oxidizing agent.

11. The method of claim 10, wherein the first and second $TiO_2$ films are formed by supplying the Ti source gas formed of the Ti compound and the oxidizing agent alternately for a plurality of times, and the $ZrO_2$-base film is formed by supplying the Zr source gas formed of the Zr compound and the oxidizing agent alternately for a plurality of times.

12. The method of claim 7, wherein an upper electrode layer is formed on the dielectric film, and a TiN film is used as the upper electrode layer and the lower electrode layer.

13. A non-transitory computer-readable recording medium storing a program operating in a computer for controlling a film forming apparatus, wherein the program controls the computer to make the film forming apparatus execute the method of forming the dielectric film according to claim 7.

* * * * *